United States Patent [19]

Embree et al.

[11] Patent Number: 5,903,190
[45] Date of Patent: May 11, 1999

[54] AMPLIFIER FEEDFORWARD ARRANGEMENT AND METHOD FOR ENHANCED FREQUENCY RESPONSE

[75] Inventors: Milton Luther Embree, Muhlenberg Township, Berks County; Robert Frederick Lee, Wyomissing, both of Pa.

[73] Assignee: Lucent Technologies Inc., Murray Hill, N.J.

[21] Appl. No.: 08/889,910

[22] Filed: Jul. 10, 1997

[51] Int. Cl.$^6$ .................................. H03F 1/00; H03F 3/68
[52] U.S. Cl. .............................................. 330/151; 330/311
[58] Field of Search .................................. 330/151, 310, 330/311, 148, 301

[56] References Cited

U.S. PATENT DOCUMENTS 4,173,741  11/1979  Kameny ................................. 331/111

OTHER PUBLICATIONS

Robert Widlar and Mineo Yamatake, Session XI: Operational Amplifiers And Voltage Regulators, *1985 IEEE International Solid–State Circuits Conference*, pp. 140–141, 325.

*Primary Examiner*—Robert Pascal
*Assistant Examiner*—Patricia T. Nguyen
*Attorney, Agent, or Firm*—John M. Harman

[57] ABSTRACT

Embodiments of the invention include an amplifier having an enhanced feedforward arrangement. In a typical operational amplifier output stage of this type, conventional feedforward arrangements comprise one or more active electrical components coupled between the second stage amplifying transistor and the negative output driver. The enhanced feedforward arrangement includes a resistor connected between the second stage amplifying transistor and the negative voltage source and a second resistor connected between the second stage amplifying transistor and the negative output driver. Alternatively, a capacitor is connected in parallel with the second resistor. In this manner, feedforward arrangements according to embodiments of the invention advantageously provide stable, enhanced frequency response, including high frequency response, e.g., above approximately 10 kHz, using economically advantageous passive rather than active electrical components. Furthermore, feedforward arrangements according to embodiments of the invention typically require less components than conventional feedforward arrangements, making them further advantageous from an economic standpoint.

14 Claims, 3 Drawing Sheets

AMPLIFIER FEEDFORWARD ARRANGEMENT AND METHOD FOR ENHANCED FREQUENCY RESPONSE

BACKGROUND OF THE INVENTION

1. Field of the Invention

The invention relates to integrated circuit devices. More particularly, the invention relates to driver output stages of integrated circuit devices.

2. Description of the Related Art

The manufacturers of integrated circuit devices have always sought improved frequency response for their circuits, especially for circuits typically operating at higher frequencies, e.g., frequencies above 10 kHz. One technique used in attempting to enhance the frequency response of, e.g., amplifier circuits including those used in operational amplifiers, is a feedforward arrangement.

Feedforward arrangements are known process control arrangements in which changes are detected near the process input and an anticipating correction signal is applied before the process output signal is affected. For example, see Widlar et al., "Operational Amplifiers And Voltage Regulators", *Digest of Technical Papers,* 1985 IEEE International Solid-State Circuits Conference, which discloses an operational amplifier having a feedforward arrangement incorporated therein.

In the Widlar article, the feedforward arrangement includes a current modulator, formed by a pair of transistors, that modulates current added to the input drive current to the negative driver output transistor. However, such arrangement includes active components and also includes compensation to prevent oscillation of the circuit. Still, the arrangement suffers from problems such as stability (especially at higher frequencies, i.e., above approximately 10 kHz).

Accordingly, a simple, low cost feedforward arrangement is sought that enhances high frequency response, yet does not suffer from operational instability or the other problems associated with conventional feedforward arrangements.

SUMMARY OF THE INVENTION

The invention is embodied in an amplifier having an enhanced feedforward arrangement. In a typical operational amplifier output stage of this type, conventional feedforward arrangements comprise one or more active electrical components coupled between the second stage amplifying transistor and the negative output driver. The enhanced feedforward arrangement includes a resistor connected between the second stage amplifying transistor and the negative voltage source and a second resistor connected between the second stage amplifying transistor and the negative output driver. Alternatively, a capacitor is connected in parallel with the second resistor. In this manner, feedforward arrangements according to embodiments of the invention advantageously provide stable, enhanced frequency response, including high frequency response, e.g., above approximately 10 kHz, using economically advantageous passive rather than active electrical components. Furthermore, feedforward arrangements according to embodiments of the invention typically require less components than conventional feedforward arrangements, making them further advantageous from an economic standpoint.

DETAILED DESCRIPTION

Figure 1:
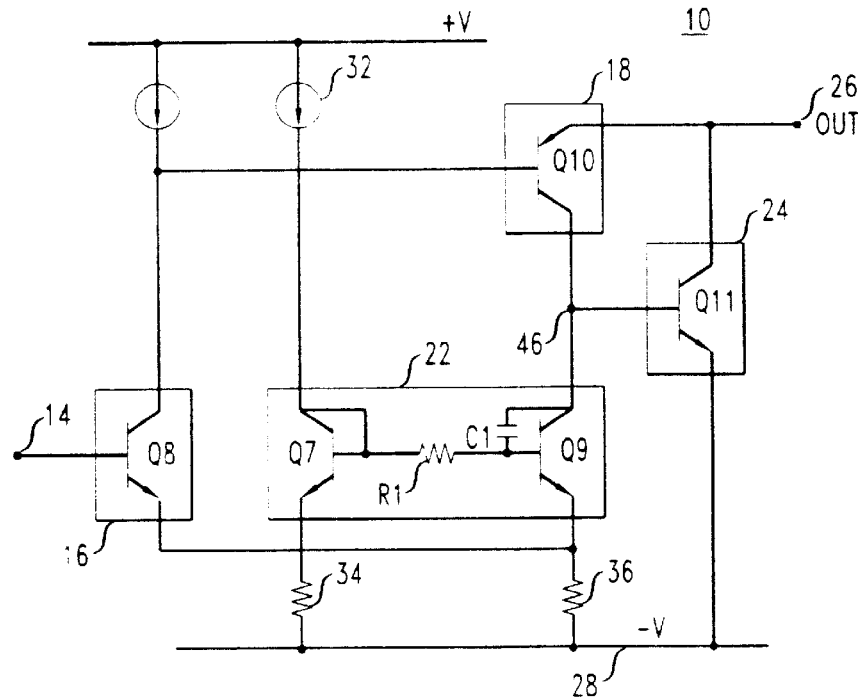
FIG. 1 is a schematic diagram of a portion of an operational amplifier including a conventional feedforward arrangement.

In the following description, similar components are referred to by the same reference numeral in order to simplify the sequential aspect of the drawings.

Although specific features, configurations and arrangements are discussed herein in terms of output stages for operational amplifiers, it should be understood that this is done for illustrative purposes only. A person skilled in the relevant art will recognize that other steps, configurations and arrangements are usable without departing from the spirit and scope of the invention.

FIG. 1 illustrates a schematic diagram of a portion of the output stage of an operational amplifier 10 having a feedforward arrangement according to Widlar et al., as discussed hereinabove. Also, FIG. 2 illustrates a feedforward arrangement within the output stage of an operational amplifier 10 that, in general, is suitably descriptive of conventional arrangements and arrangements according to embodiments of the invention.

Figure 2:
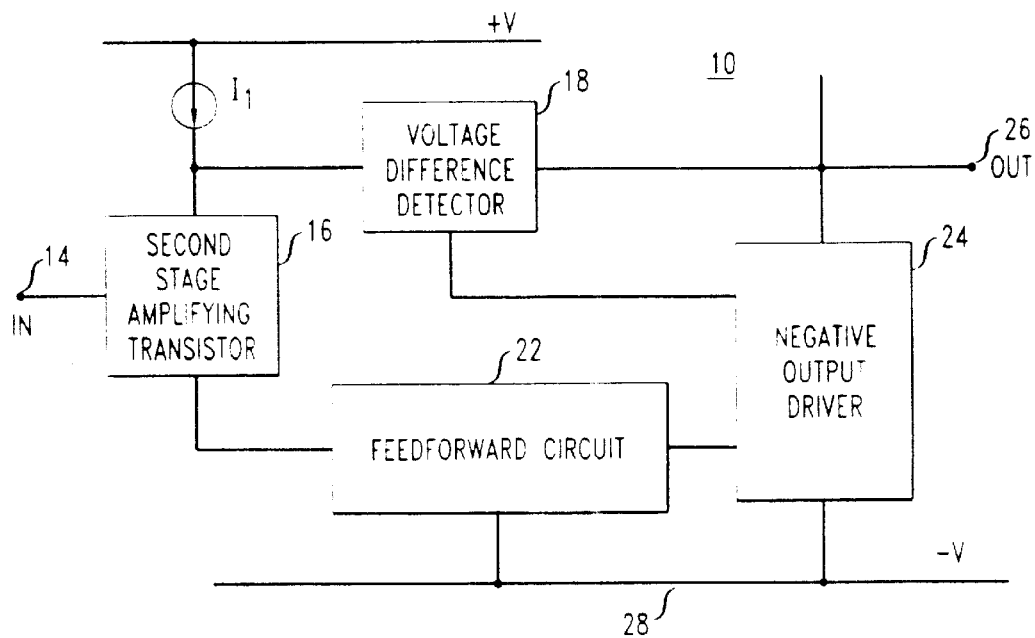
FIG. 2 is a schematic diagram of a portion of an operational amplifier suitable descriptive of conventional arrangements and arrangements according to embodiments of the invention.

In FIGS. 1–2, an input terminal 14 is connected to the base of an amplifying transistor 16, typically referred to as a second stage amplifier transistor in operational amplifiers. Second stage amplifying transistor 16, which comprises an NPN bipolar transistor Q8, is connected as shown to a voltage difference detecting transistor or other suitable voltage difference detector 18, e.g., a lateral PNP transistor Q10.

Lateral PNP transistor Q10 connects as shown to a current mirror arrangement 22 and a negative output driver 24. Negative output driver 24 comprises, e.g., an NPN transistor Q11 connected as shown between an output terminal 26 and a negative source voltage 28. In FIG. 1, current mirror arrangement 22 includes a diode-connected transistor NPN Q7, a resistor R1, a capacitor C1 and an NPN transistor Q9 connected as shown, i.e., connected generally between second stage amplifying transistor 16, a current source 32, voltage difference detector 18, negative output driver 24 and negative source voltage 28. A first resistor 34 is connected as shown between negative source voltage 28 and the emitter of Q7, and a second resistor 36 is connected as shown between negative source voltage and the emitters of Q8 and Q9.

Current mirror 22 (in both FIGS. 1 and 2) operates as a feedforward arrangement to provide an alternate current path around voltage difference detector 18 to negative output driver 24. Voltage difference detector 18 is a relatively low frequency device that typically is comprised of a relatively slow transistor Q10. Thus, the alternate, high frequency path provided by the current mirror modulator feedforward arrangement compensates for the slower frequency response of voltage difference detector 18.

More specifically, the emitter of second stage transistor Q8 feeds resistor 36 to modulate the current flowing out of the collector of transistor Q9. In this manner, Q8 and Q9 collectively function as a current modulator that initially converts the alternating current (ac) voltage signal at the base of Q8 to an ac current that is added to a fixed direct current (dc) from the current generator feeding the collector of Q8. The emitter current of Q8, which has the ac signal current superimposed on the dc current, flows through resistor 36 to create a voltage at the emitter of transistor Q9, which has a corresponding ac component superimposed on a dc value.

Since the base of Q9 is set at a constant dc value (determined by the drop across diode connected transistor Q7) and the voltage across resistor 34 caused by constant current from current generator 32, the varying voltage at the emitter of transistor Q9 results in a varying emitter-base voltage for Q9 that determines the collector current of Q9. The base-emitter voltage of Q9 decreases as its emitter voltage increases and increases as its emitter voltage decreases. Thus, the collector current of Q9 has a dc value with a superimposed ac component that has the opposite phase of the ac current component of the emitter current of transistor Q8. The ac current flowing out of the collector of Q9 is then summed along with the signal current from Q10 of the voltage difference detector 18 to form the ac drive current for Q11.

Figure 3:
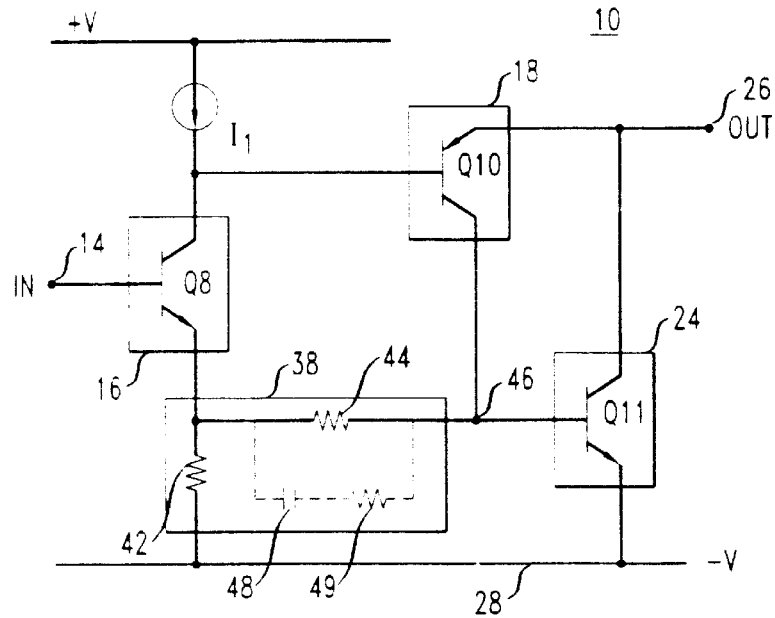
FIG. 3 is a schematic diagram of a bipolar version of a portion of an operational amplifier according to an embodiment of the invention.

FIG. 3 illustrates a portion of the output stage of an operational amplifier 10 according to embodiments of the invention. The inventive feedforward arrangement (shown as 38) advantageously uses passive electrical components or elements rather than active electrical components or elements. For purposes of discussion in this description, the terms "active component" and "active element" are understood to be any device that generates voltage or current during its operation within an impedance network. Similarly, for purposes of discussion, the terms "passive component" or "passive element" are understood to be any device of an electric circuit that is not a source of energy. For example, passive components or elements include resistors, inductors and capacitors.

In one embodiment of the invention, feedforward arrangement 38 includes a resistive load (e.g., a resistor 42) and a resistor 44 connected as shown between second stage amplifying transistor 16, voltage difference detector 18 and negative output driver 24. More specifically, load resistor 42 connects between second stage amplifying transistor 16 and negative source voltage 28, and resistor 44 connects between second stage amplifying transistor 16 and a node 46, which also is the common connection between voltage difference detector 18 and negative output driver 24. In an alternative embodiment of the invention, as will be discussed in greater detail hereinbelow, a capacitor 48, or capacitor 48 in series with a resistor 49, is connected in parallel with resistor 44 between second stage amplifying transistor 16 and node 46.

In operation, transistor Q8 functions like an emitter follower in addition to being an input amplifier. For properly chosen values of the emitter follower load resistor 42 (e.g., approximately 2000 ohms) and bias current $I_1$ (e.g., approximately 50 $\mu$A), a large portion of the signal voltage at input terminal 14 is provided at the emitter of transistor Q8, which has a typical emitter output impedance of approximately 500 ohms. At low current drive conditions of negative output drive transistor Q11 (e.g., approximately 1 mA), the input impedance of Q11 is relatively high (e.g., 2600 ohms). Accordingly, a significant portion of the voltage at input terminal 14 is transferred directly to the base-to-emitter input of Q11 via resistor 44 (e.g., approximately 7530 ohms according to embodiments of the invention). In this manner, negative output drive transistor Q11 functions in a transconductance amplifying mode with its corresponding improved frequency response.

At higher negative drive currents (e.g., 10 mA, 100 mA), the input impedance of negative output drive transistor Q11 becomes relatively low (e.g., 290 ohms, 56 ohms, respectively) compared to the relative value of resistor 44. The voltage signal occurring at the emitter of second stage amplifying transistor Q8 is converted by resistor 44 into a current that is summed with the ac current from voltage difference detector 18. The summed ac current flows into the base of negative output drive transistor Q11.

As mentioned previously herein, such operation provides a high frequency path around voltage difference detector 18, which is a relatively slow, low frequency device. In this manner, the frequency response for the device is improved by increasing the frequency response range into higher frequencies, e.g., above approximately 10 kHz.

In an alternative embodiment of the invention, a capacitor 48 is connected across resistor 44 as shown. In operation, as the operating frequency of the device increases, the reactance $X_c$ of capacitor 48 decreases. As the reactance $X_c$ of capacitor 48 decreases, the flow of current from the emitter of second stage amplifying transistor 16 directly into the base of the negative output driver 24 increases. In this manner, the high frequency path around voltage difference detector 18 is enhanced. At high frequencies, e.g., above approximately 10 kHz, such operation increases the level of negative drive current at which the mode transfer of the feedforward process takes place. Also, capacitor 48 provides a phase leading characteristic that further improves the high frequency response characteristics of the negative drive circuitry of operational amplifier 10 (e.g., by improving stability and increasing the operable frequency response range). Moreover, relatively fast voltage transitions transfer through capacitor 48 to provide a leading voltage transition directly at the base of the negative output drive transistor Q11. Such transition functions to reduce or eliminate crossover glitches.

Furthermore, embodiments of the invention advantageously simplify the feedforward operation within the operational amplifier or other suitable integrated circuit device and typically reduce the number of components needed for conventional feedforward operation. For example, transistors Q7, Q9, resistor R1 and capacitor C1 in the feedforward arrangement according to Widlar et al. (shown in FIG. 1) and resistors 34, 36 have been replaced, e.g., by resistors 42, 44 in one embodiment of the invention and by resistors 42, 44 and capacitor 48 in another embodiment of the invention.

Figure 4:
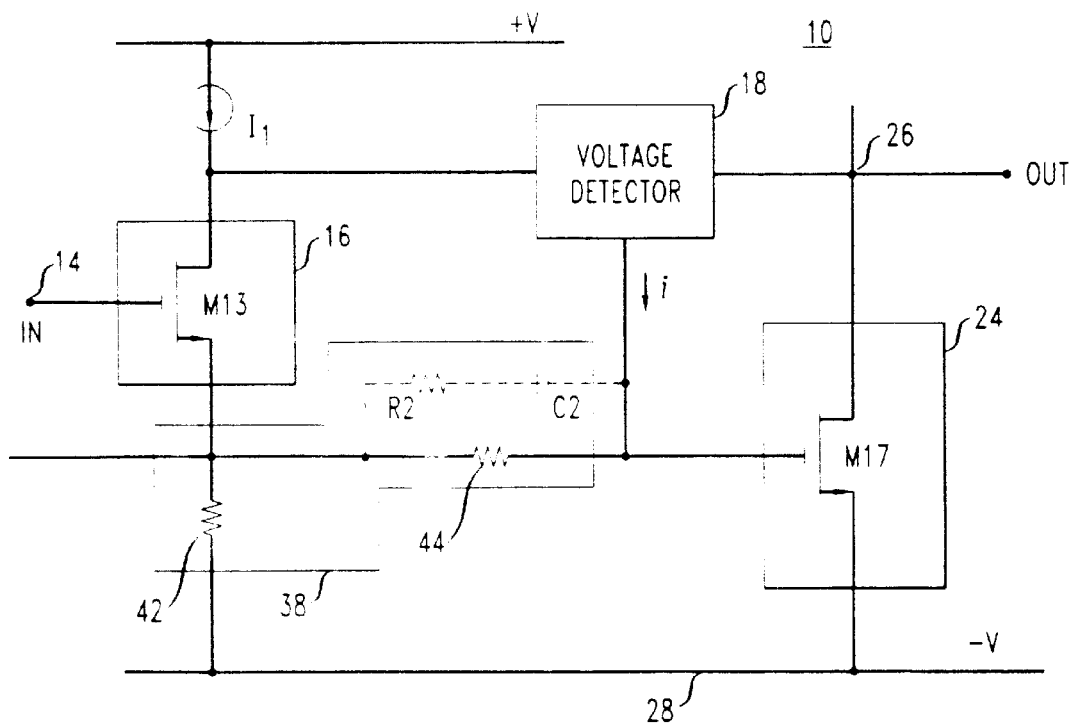
FIG. 4 is a schematic diagram of a portion of a metal-oxide semiconductor (MOS) version of an operational amplifier according to an embodiment of the invention.

Referring now to FIG. 4, a metal-oxide semiconductor (MOS) version of a feedforward arrangement according to an embodiment of the invention is shown as a portion of the output stage of an operational amplifier. Although the specific components and their arrangement in the MOS version varies slightly from the bipolar version shown in FIG. 2, the purpose remains the same: to improve the frequency response of the device, especially at higher frequencies, e.g., at frequencies above approximately 10 kHz. As will be apparent from the discussion hereinbelow, in achieving improved frequency response, the feedforward arrangement according to embodiments of the invention requires slightly more space of an integrated circuit (IC) chip, but still much less space than conventional feedforward arrangements would require.

Referring again to FIG. 4, an input terminal 14 is connected to a second stage amplifying transistor 16. Second stage amplifying transistor 16 is connected to voltage difference detector 18, which is connected directly to an output terminal 26. Voltage difference detector 18 includes any known device or arrangement of devices that converts the difference between two voltages to a control current, e.g., a single N or P channel MOS transistor or a single NPN or PNP bipolar transistor, or the combination of more than one device, such as an operational amplifier and a resistor or the combination of an operational amplifier and a transistor.

A negative output driver 24, e.g., an N-channel diffused MOS (DMOS) device M17 or, alternatively, an N-channel MOS device, is connected between output terminal 26 and negative source voltage 28. Negative output driver 24 also is connected to voltage difference detector 18, as shown. Typically, second stage amplifying transistor M13 is the same type of transistor as M17.

A feedforward arrangement (shown as 38) according to an embodiment of the invention is connected generally between second stage amplifying transistor 16, voltage difference detector 18 and negative output driver 24. Feedforward arrangement 38 includes, e.g., a load resistor 42 and a resistor 44. Load resistor 42 is connected as shown between second stage amplifying transistor 16 and negative source voltage 28. Second resistor 44 has a first end connected to load resistor 42 and second stage amplifying transistor 16 and a second end connected to negative output driver 24.

Alternatively, to enhance performance, feedforward arrangement 38 includes a capacitor $C_2$ and another resistor $R_2$, connected as shown. More specifically, capacitor $C_2$ and resistor $R_2$ are connected in series between the source of second stage amplifying transistor 16 (i.e., M13) and the gate of negative output driver 24 (i.e., M17).

Figure 5:
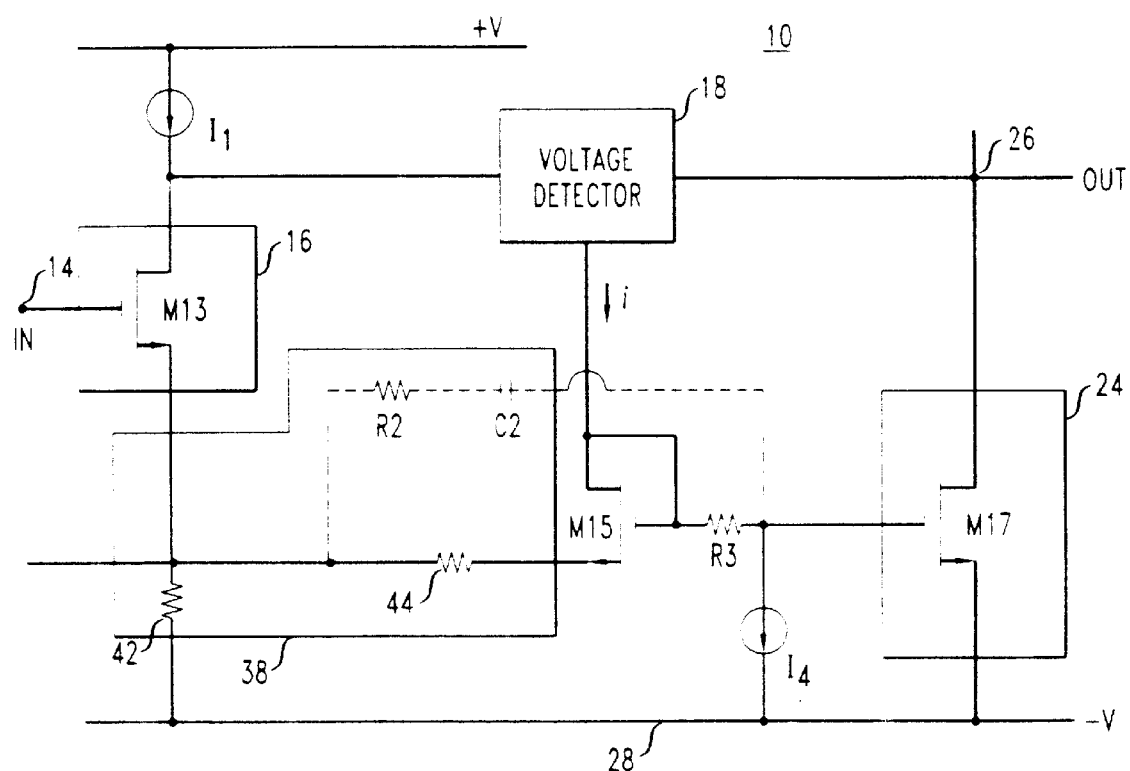
FIG. 5 is a schematic diagram of a portion of a metal-oxide semiconductor (MOS) version of an operational amplifier according to an alternative embodiment of the invention.

In another alternative embodiment (typically when device M17 is a DMOS device), an additional N-channel, diode-connected DMOS M15, a relatively low value resistor $R_3$, and a current source $I_4$ are connected as shown in FIG. 5. The gate and drain of diode-connected DMOS device M15 are connected through $R_3$ to the gate of N-channel DMOS M17 and one end of current source $I_4$. Also, the source of diode-connected DMOS device M15 is connected to one end of resistor 44. The second end of current source $I_4$ connects to negative source voltage 28.

In general, the feedforward arrangement 38 shown in FIGS. 4–5 improves the frequency response (e.g., by improving stability and increasing the operable frequency response range) of operational amplifier 10 by shunting around voltage difference detector 18. More specifically, the source of second stage amplifying transistor 16 operates as a voltage source by source follower action.

The voltage potential brought about by second stage amplifying transistor 16 is applied to negative output driver 24 (e.g., to the gate of N-channel DMOS M17) whose input impedance is relatively high. In alternative embodiments, e.g., those employing diode-connected DMOS device M15, the voltage potential brought about by second stage amplifying transistor 16 is applied to the source of diode-connected DMOS device M15, whose impedance is relatively low compared to the input impedance of device M17 and the output impedance of voltage difference detector 18. The feedforward signal from second stage amplifying transistor M13 to negative output driver 24 advantageously makes use of the relatively low impedance of resistor 44 and diode-connected DMOS M15 to deliver the desired feedforward signal, even at relatively high frequencies, e.g., frequencies up to approximately 10 MHz and perhaps up to approximately 100 MHz for some very high frequency MOS processes.

In operation, above relatively low negative drive currents (e.g., above approximately 0.5 mA) and up to moderately high frequencies (e.g., to approximately 500 kHz), substantially all of the voltage signal at the source of second stage amplifying transistor M13 is delivered to the gate of device M17. At low negative drive currents and very high frequencies (e.g., approximately 1 to approximately 100 MHz), a capacitive dividing action takes place between the capacitance of diode-connected DMOS device M15 and the input capacitance of DMOS device M17.

At moderate to high negative drive currents (e.g., above approximately 0.5 mA), the current through device M15 from voltage difference detector 18 reduces the impedance of diode-connected device M15 to the extent that most of the voltage signal at the source of second stage amplifying transistor M13 is delivered to the gate of device M17. At extremely high frequencies (e.g., greater than approximately 100 MHz), the input capacitance of device M17 dominates and reduces the drive signal significantly.

Alternatively, if necessary, devices such as current source $I_4$ and additional resistors such as R3 are added to eliminate undesirable effects of dc voltage drop across load resistor 42, such as excess quiescent current. However, if such devices are not needed, they are set to zero or not included in the circuit.

It will be apparent to those skilled in the art that many changes and substitutions can be made to embodiments of the feedforward arrangement herein described without departing from the spirit and scope of the invention as defined by the appended claims and their full scope of equivalents.

What is claimed is:

1. An integrated circuit having a feedforward arrangement coupled between an amplyifying transistor, a voltage difference detector and a negative output driver, said feedforward arrangement comprising:

a resistive load coupled to said amplifying transistor, said amplifying transistor and said resistive load providing a voltage signal at an output of said amplifying transistor, said voltage signal based on the input signal to the amplifying transistor, the electrical resistance of said resistive load and a bias current applied to said amplifying transistor;

an electrical resistance operably coupled between said voltage signal and said negative output driver, wherein said electrical resistance transfers said voltage signal to an input of said negative output driver in such a way that a feedforward path is provided between said amplifying transistor and said negative output driver that does not include said voltage difference detector, said feedforward path being provided substantially without the use of active components; and a capacitor coupled in parallel across said electrical resistance.

2. The integrated circuit as recited in claim 1, wherein said resistive load is a resistor connected between said amplifying transistor and a negative source voltage of said integrated circuit.

3. The integrated circuit as recited in claim 1, wherein said electrical resistance is a resistor connected between said amplifying transistor and said negative output driver.

4. The integrated circuit as recited in claim 1, wherein said amplifying transistor includes an NPN bipolar transistor and wherein said resistive load is a resistor having a first end connected to an emitter of said NPN bipolar transistor and a second end connected to a negative source voltage of said integrated circuit.

5. The integrated circuit as recited in claim 1, wherein said amplifying transistor includes an N-channel MOS transistor and wherein said resistive load is a resistor having a first end connected to a source of said N-channel MOS transistor and a second end connected to a negative source voltage of said integrated circuit.

6. The integrated circuit as recited in claim 1, further comprising at least one resistor connected in series with the capacitor that is coupled in parallel across said electrical resistance.

7. The integrated circuit as recited in claim 1, wherein said negative output driver includes an NPN bipolar transistor having a collector connected to an output terminal of said integrated circuit, a base connected to said voltage difference detector and an emitter connected to a negative source voltage of said integrated circuit.

8. The integrated circuit as recited in claim 1, wherein said negative output driver includes an N-channel MOS having a drain connected to an output terminal of said integrated circuit, a gate connected to said voltage difference detector, and a source connected to a negative source voltage of said integrated circuit.

9. The integrated circuit as recited in claim 1, wherein said amplifying transistor includes an NPN bipolar transistor, wherein said negative output driver includes an NPN bipolar transistor having a collector connected to an output terminal of said integrated circuit, a base connected to said voltage difference detector, and an emitter connected to a negative source voltage of said integrated circuit, and wherein said electrical resistance is a resistor having a first end connected to an emitter of the NPN bipolar transistor included in said amplifying transistor and a second end connected to said voltage difference detector and to the base of the NPN bipolar transistor included in said negative output driver transistor.

10. The integrated circuit as recited in claim 1, wherein said amplifying transistor includes an N-channel MOS transistor, wherein said negative output driver includes an N-channel MOS having a drain connected to an output terminal of said integrated circuit, a gate connected to said voltage difference detector, and a source connected to a negative source voltage of said integrated circuit, and wherein said electrical resistance is a resistor having a first end connected to a source of the N-channel MOS transistor included in said amplifying transistor and a second end connected to the gate of the N-channel MOS included in said negative output driver.

11. The integrated circuit as recited in claim 1, wherein said amplifying transistor includes an N-channel MOS transistor, wherein said negative output driver includes an N-channel MOS having a drain connected to an output terminal of said integrated circuit and a source connected to a negative source voltage of said integrated circuit, wherein said integrated circuit further comprises a diode-connected N-channel MOS having a drain and a gate connected to said voltage difference detector, and wherein said electrical resistance is a resistor having a first end connected to a source of the N-channel MOS transistor included in said amplifying transistor and a second end connected to a source of the diode-connected N-channel MOS.

12. A feedforward method for use in an integrated circuit having an amplifier with an amplifying transistor, a voltage difference detector and a negative output driver, said feedforward method comprising the steps of:

providing a voltage signal at an output of said amplifying transistor; and transferring said voltage signal to an input of said negative output driver in such a way that a feedforward path is provided between said amplifying transistor and said negative output driver that does not include said voltage difference detector, said providing and transferring steps being performed substantially without the use of active components, wherein said providing step includes connecting a resistive load between said amplifying transistor and a negative source voltage of said integrated circuit, connecting an electrical resistance between the voltage signal at the output of said amplifying transistor and said negative output driver, and connecting a capacitor in parallel across said electrical resistance.

13. The method as recited in claim 12, wherein said negative output driver includes an NPN bipolar transistor having a collector connected to an output terminal of said integrated circuit, a base connected to said voltage difference detector and an emitter connected to a negative source voltage of said integrated circuit, and wherein said applying step further comprises applying said feedforward signal to said base of said negative output driver.

14. The method as recited in claim 12, wherein said negative output driver includes an N-channel MOS having a drain connected to an output terminal of said integrated circuit, a gate connected to said voltage difference detector, and a source connected to a negative source voltage of said integrated circuit, and wherein said applying step further comprises applying said feedforward signal to the source of said N-channel MOS included in said negative output driver.

* * * * *